(12) United States Patent
Liu et al.

(10) Patent No.: US 8,637,372 B2
(45) Date of Patent: Jan. 28, 2014

(54) METHODS FOR FABRICATING A FINFET INTEGRATED CIRCUIT ON A BULK SILICON SUBSTRATE

(75) Inventors: Yanxiang Liu, Wappingers Falls, NY (US); Xiaodong Yang, Hopewell Junction, NY (US); Jinping Liu, Hopewell Junction, NY (US)

(73) Assignee: Globalfoundries, Inc., Grand Cayman (KY)

( * ) Notice: Subject to any disclaimer, the term of this patent is extended or adjusted under 35 U.S.C. 154(b) by 338 days.

(21) Appl. No.: 13/172,635

(22) Filed: Jun. 29, 2011

(65) Prior Publication Data

US 2013/0005103 A1 Jan. 3, 2013

(51) Int. Cl.
*H01L 21/336* (2006.01)

(52) U.S. Cl.
USPC ............... 438/285; 257/E21.19; 438/478

(58) Field of Classification Search
USPC ................... 438/285, 478, 703, 763, 692
See application file for complete search history.

(56) References Cited

U.S. PATENT DOCUMENTS

| 6,833,588 B2 * | 12/2004 | Yu et al. ............... 257/347 |
| 6,936,875 B2 * | 8/2005 | Sugii et al. ........... 257/288 |
| 7,109,121 B2 * | 9/2006 | Lal et al. .............. 438/703 |

OTHER PUBLICATIONS

T. Salvetat et al., "Comparison between three Si1-xGex versus Si selective etching processes", 214th ECS Meeting, Oct. 12-17, 2008, Honolulu, HI. ECS transaction vol. 16, Issue 10 p. 439-449.

Monfray, S. et al., "Localized SOI Technology: an innovative Low Cost self-aligned process for Ultra Thin Si-film on thin BOX integration for Low Power applications", IEDM Dec. 10-12, 2007, p. 693-696.

* cited by examiner

*Primary Examiner* — Savitr Mulpuri

(74) *Attorney, Agent, or Firm* — Ingrassia Fisher & Lorenz, P.C.

(57) ABSTRACT

Methods are provided for fabricating a FINFET integrated circuit that includes epitaxially growing a first silicon germanium layer and a second silicon layer overlying a silicon substrate. The second silicon layer is etched to form a silicon fin using the first silicon germanium layer as an etch stop. The first silicon germanium layer underlying the fin is removed to form a void underlying the fin and the void is filled with an insulating material. A gate structure is then formed overlying the fin.

14 Claims, 5 Drawing Sheets

METHODS FOR FABRICATING A FINFET INTEGRATED CIRCUIT ON A BULK SILICON SUBSTRATE

TECHNICAL FIELD

The present invention generally relates to methods for manufacturing integrated circuits, and more particularly relates to methods for manufacturing FINFET integrated circuits on bulk silicon substrates.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the dual goals of reducing transistor size while maintaining transistor performance. The FINFET is a three dimensional transistor formed in a thin fin that extends upwardly from a semiconductor substrate. Transistor performance, often measured by its transconductance, is proportional to the width of the transistor channel. In a FINFET the transistor channel is formed at least along the vertical sidewalls of the fin, so a wide channel, and hence high performance, can be achieved without substantially increasing the area of the substrate surface required by the transistor.

Many FINFET ICs are fabricated on semiconductor-on-insulator (SOI) substrates because of the easy isolation provided by the buried oxide layer. SOI substrates are expensive, however, so there are significant economic advantages to fabricating the ICs on bulk wafers. A number of techniques have been attempted to provide isolation between fins of a bulk wafer FINFET IC, but such attempts have had limited success. Among the disadvantages of such isolation techniques are processing difficulties, complicated processing, and, most importantly, variability of the final height of the fin. The height of the fin determines the width of the transistor channel which, in turn, determines the drive capability of the transistor. Variability in fin height thus makes it difficult to reproducibly fabricate transistors having the device characteristics needed for the circuit being implemented.

Accordingly, it is desirable to provide methods for fabricating FINFET ICs having fins of predetermined and reproducible height. In addition, it is desirable to provide methods for fabricating FINFET ICs having dielectric isolation between fins. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating FINFET integrated circuits on a bulk substrate. In accordance with one embodiment a method includes epitaxially growing a first silicon germanium layer and a second silicon layer overlying a silicon substrate. The second silicon layer is etched to form a silicon fin using the first silicon germanium layer as an etch stop. The first silicon germanium layer underlying the fin is removed to form a void underlying the fin and the void is filled with an insulating material. A gate structure is then formed overlying the fin.

In accordance with another embodiment a method for fabricating a FINFET integrated circuit includes growing a silicon germanium epitaxial layer overlying a silicon substrate and growing a silicon epitaxial layer overlying the silicon germanium epitaxial layer. Shallow trench isolation is formed to define a device region. The silicon epitaxial layer is etched in an etchant that etches silicon at a substantially higher etch rate than the etch rate of silicon germanium to form a silicon fin extending across the device region and contacting the shallow trench isolation. The silicon germanium epitaxial layer is etched in an etchant that etches silicon germanium at a substantially higher etch rate than the etch rate of silicon to form a void underlying the silicon fin. A dielectric is deposited overlying the silicon fin and filling the void, and a planarizing layer is deposited overlying the dielectric. The planarizing layer and the dielectric are etched to remove the dielectric overlying the silicon fin and a gate dielectric and a gate electrode are formed overlying the silicon fin.

In accordance with yet another embodiment a method for fabricating a FINFET integrated circuit includes forming a shallow trench isolation defining a device region in a silicon substrate. A first crystalline layer is formed overlying the substrate and a silicon layer is formed overlying the first crystalline layer. The silicon layer is patterned to form a fin extending across the device region and contacting the shallow trench isolation. A gate structure is formed overlying the fin. The first crystalline layer underlying the fin is removed and a dielectric layer is deposited underlying and supporting the fin.

BRIEF DESCRIPTION OF THE DRAWINGS

The present invention will hereinafter be described in conjunction with the following drawing figures, wherein like numerals denote like elements, and wherein:

FIGS. 1-5 and 7-9 are cross sectional views;

FIG. 6 is a plan view; and

FIG. 10 is a partially cut away perspective view.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-10 illustrate method steps for fabricating a FINFET integrated circuit (IC) 100 in accordance with various embodiments. The described process steps, procedures, and materials are to be considered only as exemplary embodiments designed to illustrate to one of ordinary skill in the art methods for practicing the invention; the invention is not to be limited to these exemplary embodiments. Various steps in the manufacture of ICs are well known and so, in the interest of brevity, many conventional steps will only be mentioned briefly herein or will be omitted entirely without providing the well known process details. The FIGURES illustrate only a single FINFET 200 of IC 100 although those of skill in the art will understand the IC may contains a large number of such devices as required by the circuit being implemented.

Figure 1:
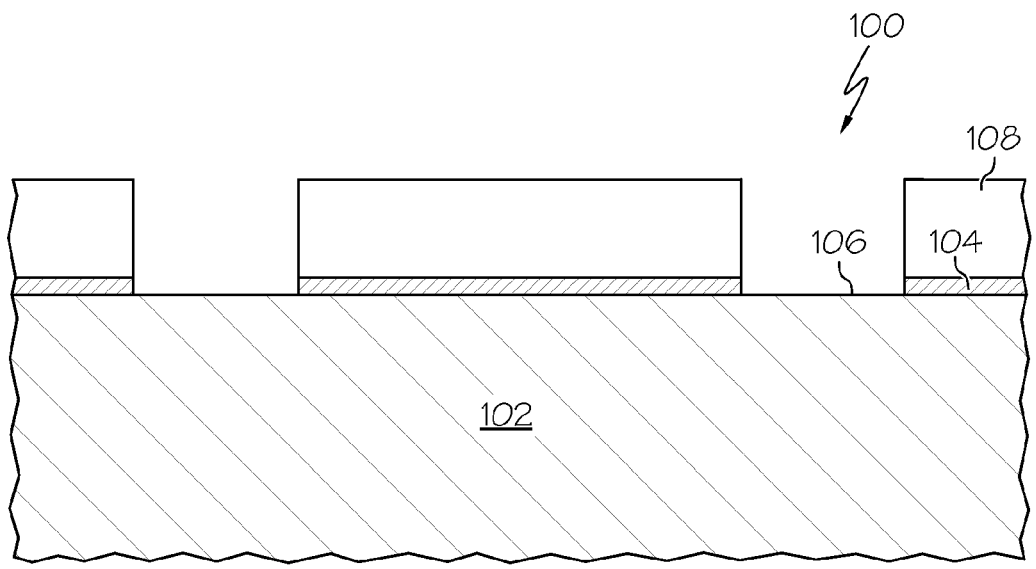
FIGS. 1-10 illustrate methods for fabricating a FINFET IC in accordance with various embodiments.

The fabrication of FINFET IC 100, in accordance with one embodiment, begins as illustrated in cross section in FIG. 1 with the provision of a silicon substrate or wafer 102. A thin layer of pad oxide 104 is formed on upper surface 106 of the substrate. A layer of silicon nitride 108 is deposited overlying the pad oxide. The layer of pad oxide and the layer of silicon nitride are patterned using conventional photolithography and etch techniques to expose a portion of the substrate in which shallow trench isolation (STI) 110 is to be formed as described in the following.

Figure 2:
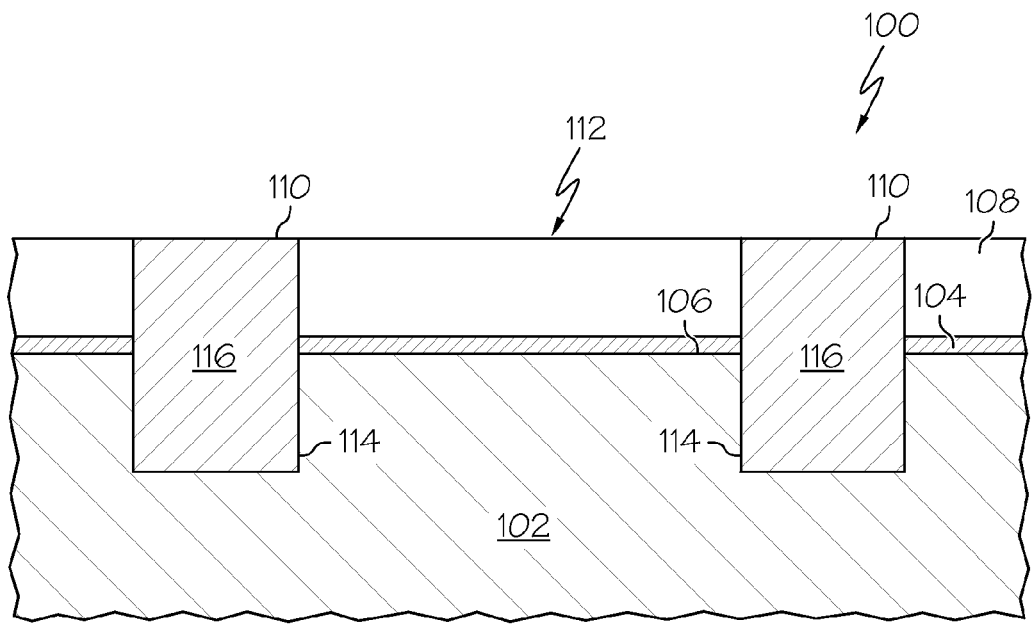

As illustrated in FIG. 2, STI 110 defines a device region 112 in the substrate and provides electrical isolation between devices as is required by the circuit design. As illustrated in the following, only one FINFET is to be fabricated in device region 112. There will be many such device regions in IC 100 and any number of FINFETs may be fabricated in some of those device regions. The patterned silicon nitride layer 108 is used as a hard etch mask and trenches 114 are etched into the silicon substrate. The trenches are filled with a dielectric material 116 such as a silicon oxide to provide electrical isolation between device region 112 and similar device regions outside the STI. The method continues by planarizing dielectric material 116 that fills trenches 114. The dielectric material can be planarized, for example by chemical mechanical planarization (CMP) using nitride layer 108 as a polish stop.

Figure 3:
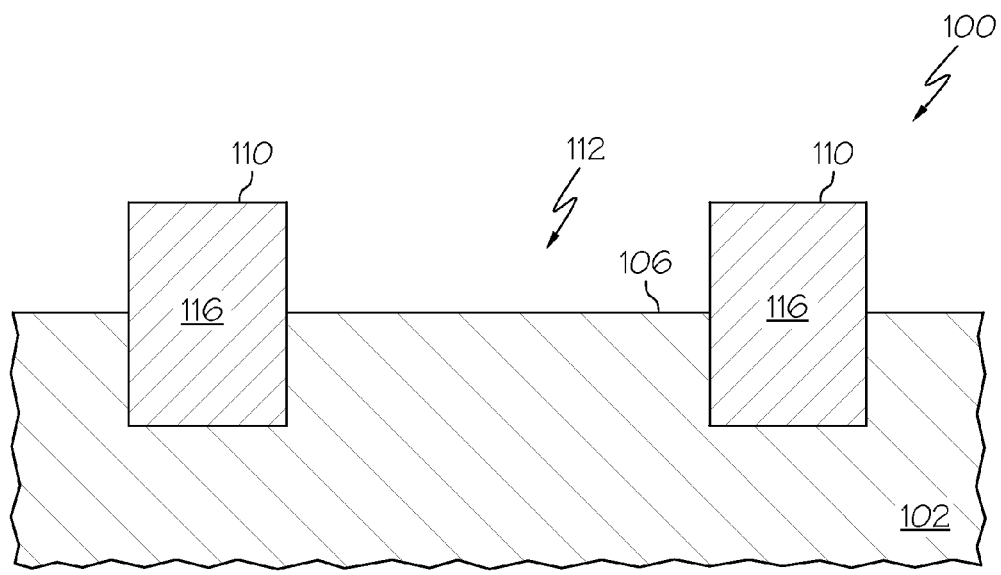

Following the planarization the remaining silicon nitride and pad oxide are removed and the remaining portion of surface 106 within device region 112 is cleaned as illustrated in FIG. 3. Dielectric material 116 protrudes above surface 106 by an amount substantially equal to the total thickness of pad oxide 104 and silicon nitride 108.

Figure 4:
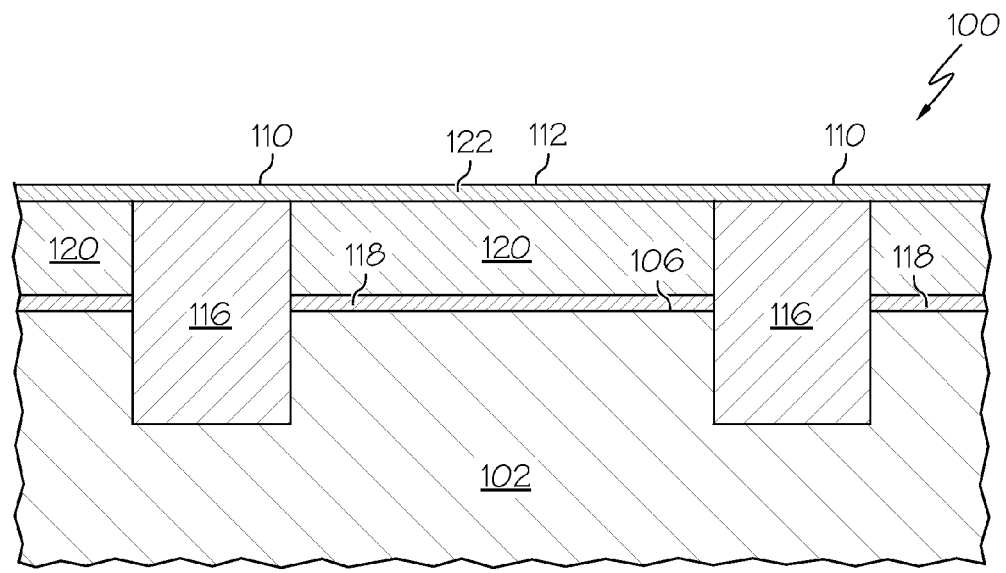

In accordance with one embodiment a layer 118 of silicon germanium (SiGe) or other crystalline material is epitaxially grown on surface 106 within device region 112 by a process of selective epitaxial growth as illustrated in FIG. 4. A layer of silicon 120 is epitaxially grown overlying the layer of SiGe, also by a process of selective epitaxial growth. In the process of selective epitaxial growth the growth conditions and reactants are adjusted so that the material layer being grown grows only on crystalline material and does not grow on non-crystalline materials such as dielectric material 116. Layer 118 of SiGe preferably contains at least 20% germanium and has a thickness of a few tens of nanometers (nm). Layer 118 can be, for example about 10-30 nm. The thickness of layer of silicon 120 determines the height of the fin that is to be formed. The height of the fin is determined by the desired transistor characteristics of the integrated circuit being fabricated, but can be, for example, between about 25 nm and 125 nm and preferably about 100 nm. The total height of layers 118 and 120 together are preferably substantially the same as the height that dielectric material 116 protrudes above surface 106. Layer of silicon 120 can be undoped or can be doped with conductivity determining impurities depending on the desired characteristics of the channel region of FINFET 200. A layer of hard mask material 122 such as a layer of silicon nitride is deposited overlying layer 120 of silicon. Other crystalline material besides SiGe can be used as the crystalline layer underlying layer 120 of silicon providing the material is differentially etchable with respect to silicon (i.e., a material etchant exists that etches silicon at a much lower rate than the etch rate of the material and a silicon etchant exists that etches the material at much lower etch rate than the etch rate of silicon) and providing the crystalline nature of the material is such that a high quality crystalline layer of silicon can be grown on that material. Although not illustrated, in an alternate embodiment, alignment marks are etched in the surface of the wafer, the epitaxial layers are grown, and then the STI is formed. This embodiment has the advantage that the epitaxial layers are grown on a flat surface without pattern loading effects.

Figure 5:
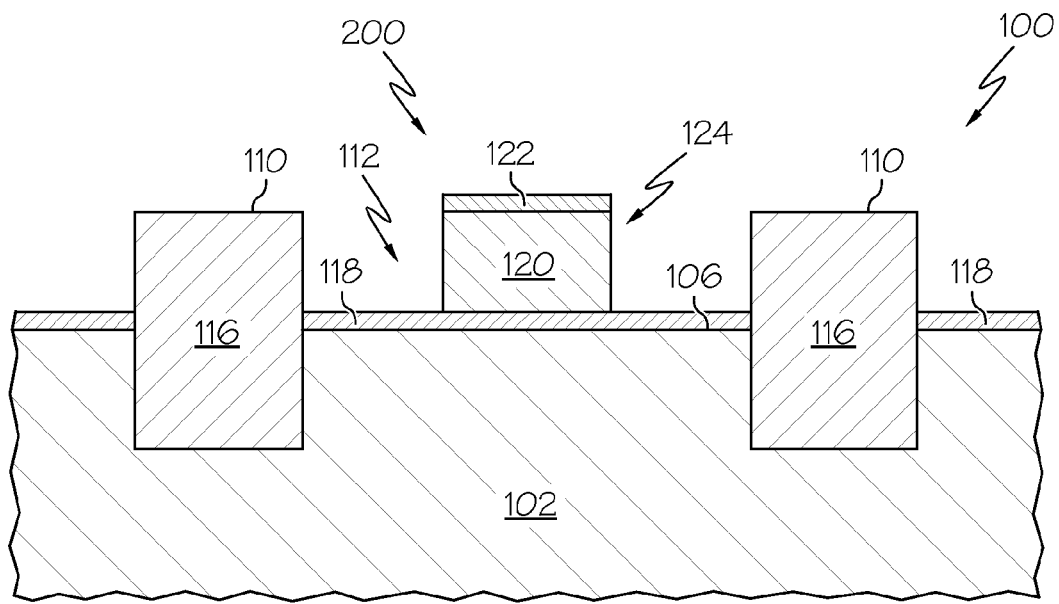
Figure 6:
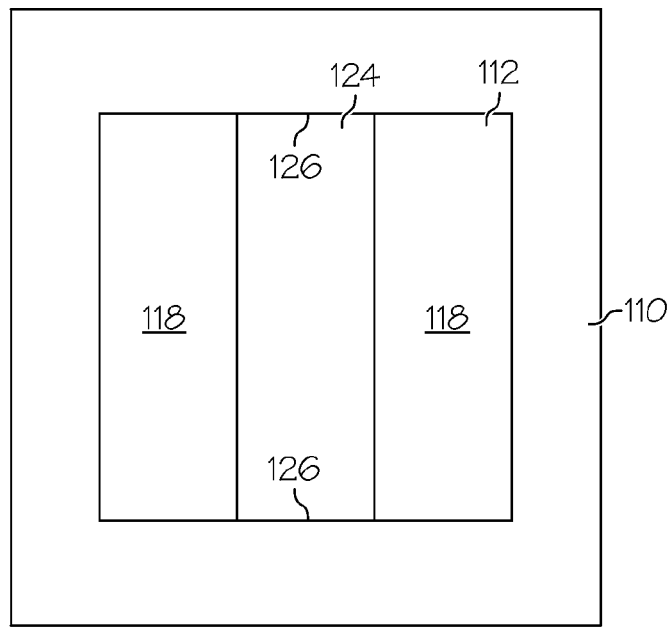

As illustrated in FIG. 5, the method for fabricating FINFET IC 100 continues, in accordance with one embodiment, by patterning hard mask layer 122 using conventional photolithographic and etch techniques. The patterned hard mask layer is used as an etch mask and layer 120 of silicon is etched to form a fin 124. The layer of silicon is etched using an anisotropic etch process such as reactive ion etching (RIE) using an etchant such as a mixture of $O_2$, $N_2$, and $CH_2F_2$ that etches silicon at a substantially higher etch rate than the etch rate of silicon germanium. The layer of silicon germanium thus acts as an etch stop and the height of fin 124 is determined solely by the thickness of the epitaxial layer of silicon. Epitaxial growth is an atomic-layer-by-atomic-layer growth process that can be precisely controlled, so the thickness of layer 120 and the height of fin 124 can be precisely controlled. FIG. 6 illustrates FINFET 100 in plan view. Fin 124 extends across device region 112 with the ends 126 of the fin abutting STI 110. Patterned hard mask 122 is removed in an etchant that preferentially etches the hard mask material but not the silicon or silicon germanium. If the hard mask material is silicon nitride, for example, the silicon nitride can be removed in hot phosphoric acid.

Figure 7:
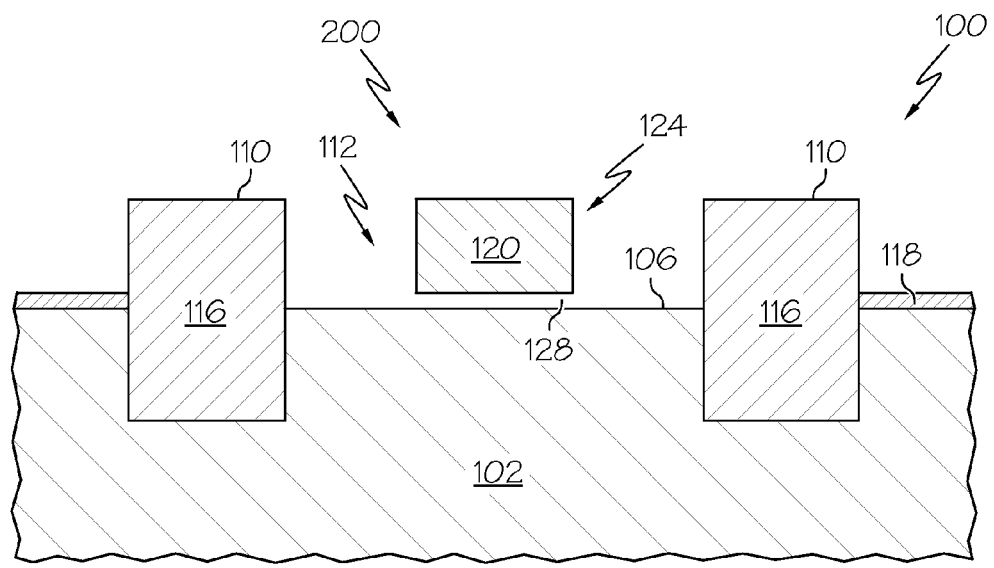

After etching layer 120 of silicon to form fin 124, SiGe layer 118 is removed as illustrated in FIG. 7 to create a void 128 underlying fin 124. SiGe layer 118 is removed by etching in an etchant that etches SiGe at a substantially faster etch rate than the etch rate of the silicon of fin 124 or the silicon oxide or other insulating material filling STI 110. The SiGe can be etched, for example, in a gaseous mixture of hydrochloric acid and hydrogen, in an aqueous solution of hydrofluoric acid, nitric acid and acetic acid, or in a plasma $CF_4$ etchant. Again, because the selected etchant has a very low etch rate for silicon, the height of fin 124 is substantially unaffected. In the cross sectional view of FIG. 7 fin 124 appears to be floating above void 128. Fin 124, however, is supported at ends 126 as they contact STI 110.

Figure 8:
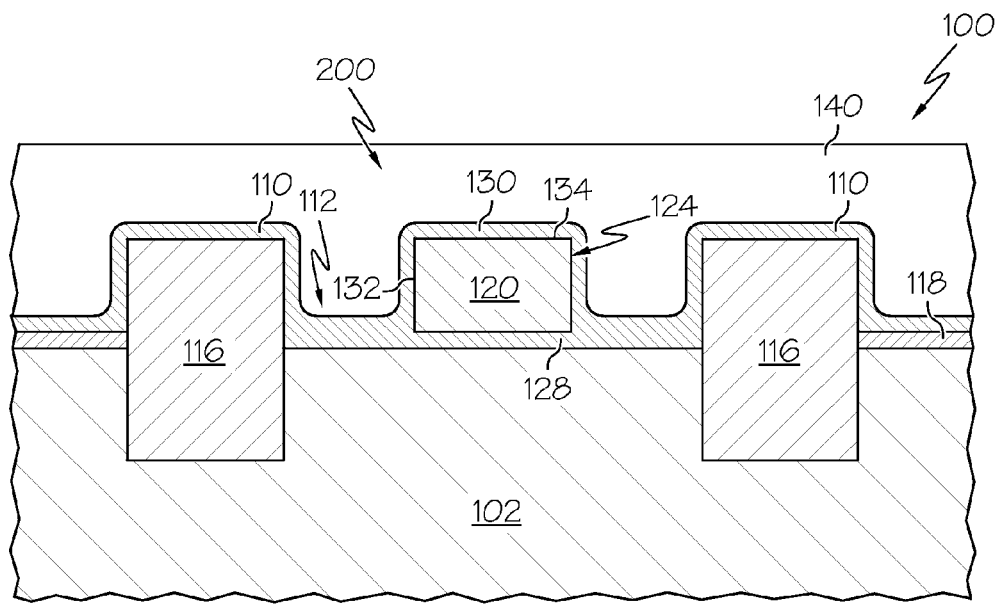

As illustrated in FIG. 8, the void underlying fin 124 is filled with a dielectric insulating material 130 such as silicon oxide, silicon nitride, or mixtures thereof. The dielectric material can be deposited by chemical vapor deposition (CVD) or, preferably, by atomic layer deposition (ALD). Especially if the dielectric material is deposited by ALD, the layer is substantially conformal. The dielectric material must be removed from the sidewalls 132 and top surface 134 of fin 124 because that is where the channel of FINFET 200 will be formed. To aid in removing dielectric material 130, a planarizing layer 140 such as an organic planarizing layer (OPL) is applied overlying dielectric material 130. OPL is spun on as a liquid and is subsequently cured to form a solid having a planar upper layer. Alternatively, a thick layer of material can be deposited, for example by CVD and subsequently planarized by CMP. In accordance with either alternative the material selected for planarizing layer 140 is a material having substantially the same etch rate as the etch rate of dielectric material 130 and a substantially faster etch rate than the etch rate of the silicon fin.

Figure 9:
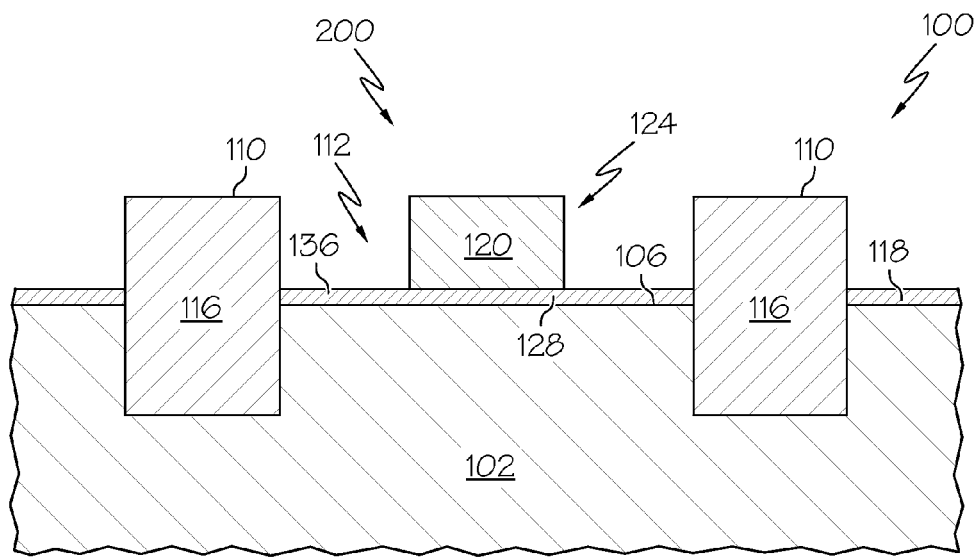

Planarizing layer 140 and dielectric material 130 are anisotropically etched, for example by reactive ion etching (RIE) to remove the dielectric material from the sidewalls and top surface of fin 124 as illustrated in FIG. 9. The etching is stopped when the dielectric material has been removed from the sidewalls and the top surface. A layer 136 of dielectric material remains overlying the exposed portion of surface 106 and filling void 128 underlying fin 124. Layer 136 supports fin 124 and electrically isolates the fin from substrate 102. Fin 124 is thus electrically isolated from other devices and from other fins by layer 136 and by STI 110.

Figure 10:
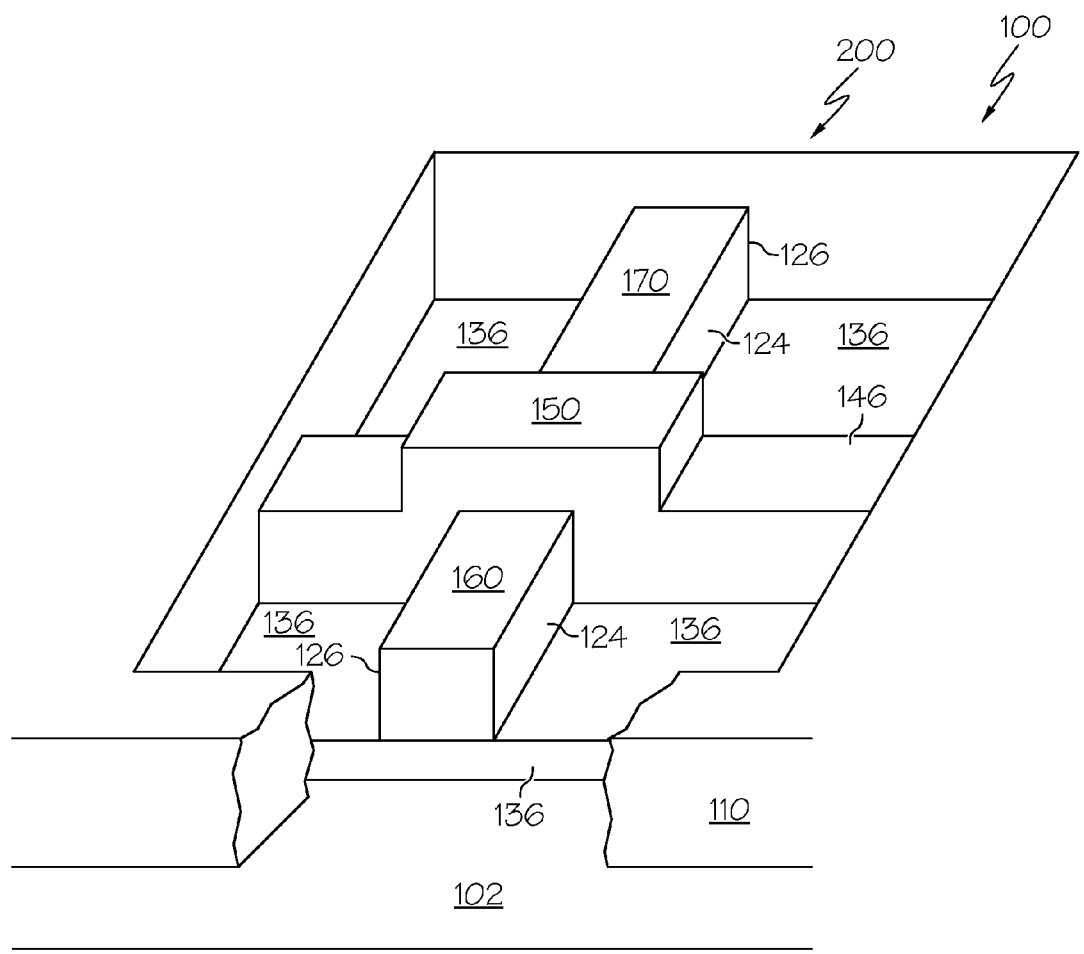

The method for fabricating FINFET IC 100 in accordance with one embodiment continues as illustrated in FIG. 10 which is a partially cut away perspective view of FINFET 200. A gate structure 146 is formed overlying fin 124. The gate structure includes a layer of gate dielectric material and a gate electrode. A layer of gate dielectric material (not illustrated) such as silicon oxide, a high dielectric constant (high k) insulator, or combinations thereof is deposited or otherwise formed overlying fin 124. A layer of gate electrode forming material is deposited overlying the gate dielectric material and is patterned to form a gate electrode 150. Although not so illustrated, gate electrode 150 can extend onto and over STI 110. The gate electrode material can be polycrystalline silicon, a metal or other conductive material and may also include a work function determining layer. The gate electrode structure may also include sidewall spacers formed on the sidewalls of the gate electrode in conventional manner.

Although not illustrated, the method for fabricating FINFET IC continues in conventional manner by impurity doping the end portions 160, 170 of fin 124 with conductivity determining impurities to form source and drain regions. The impurity doping can be done by ion implantation or by plasma doping, with either doping technique using the gate structure as a doping mask so that the source and drain regions are self aligned to the gate structure. Contacts to the source and drain regions can also be formed in conventional manner, for example by depositing a layer of insulating material, etching openings through the insulating material to expose portions of the source and drain regions, and filling the openings with metal or other conductive material.

In the above-described embodiments a layer of crystalline material 118 such as a layer of SiGe is removed (FIG. 7) to create a void 128 underlying fin 124 and is replaced by a dielectric layer 130 that fills the void (FIG. 8). A gate structure 146 is then formed overlying fin 124 (FIG. 10). Although not illustrated, gate structure 146 can be formed overlying fin 124 before the layer of crystalline material 118 is removed. The layer of dielectric material 130 is then deposited to fill void 128 and to underlie gate structure 146. Excess portions of the layer of dielectric material can then be removed, for example by RIE, to form sidewall spacers on the sidewalls of gate structure 146, leaving a remaining layer of dielectric material 136 underlying and supporting fin 124 and gate structure 146.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating a FINFET integrated circuit comprising;

epitaxially growing a first silicon germanium layer and a second silicon layer overlying a silicon substrate;

etching the second silicon layer to form a silicon fin using the first silicon germanium layer as an etch stop;

removing the first silicon germanium layer underlying the fin to form a void underlying the fin;

filling the void underlying the fin with an insulating material, wherein a layer of insulating material further remains overlying an exposed portion of a surface of the silicon substrate outside of the void underlying the fin;

depositing a planarizing layer overlying the silicon fin and the insulating material;

etching the planarizing layer and the insulating material in an etchant that etches the planarizing layer and the insulating material at substantially the same rate and at a rate faster than the etch rate of the silicon fin; and stopping the etching when the insulating material is removed from the sidewalls and top surface of the silicon fin; and forming a gate structure overlying the fin and the layer of insulating material that remains overlying the exposed portion of the surface of the silicon substrate outside of the void underlying the fin.

2. The method of claim 1 wherein epitaxially growing a first silicon germanium layer comprises growing a silicon germanium layer comprising at least 20% germanium.

3. The method of claim 1 wherein removing comprises removing the first silicon germanium layer in an etchant that etches silicon germanium at a substantially faster rate than silicon.

4. The method of claim 1 wherein filling the void comprises depositing a material selected from the group consisting of silicon oxide, silicon nitride, and mixtures thereof by a process of atomic layer deposition.

5. The method of claim 1 wherein forming a gate structure comprises:

forming a gate insulator overlying the silicon fin;

depositing a layer of gate electrode material overlying the gate insulator; and patterning the gate electrode material to form a gate electrode.

6. The method of claim 5 further comprising:

doping the silicon fin with conductivity determining dopant impurities using the gate electrode as a dopant mask to form source and drain regions.

7. The method of claim 6 further comprising forming electrical contacts to the source and drain regions.

8. A method for fabricating a FINFET integrated circuit comprising;

growing a silicon germanium epitaxial layer overlying a silicon substrate;

growing a silicon epitaxial layer overlying the silicon germanium epitaxial layer;

forming a shallow trench isolation defining a device region;

etching the silicon epitaxial layer in an etchant that etches silicon at a substantially higher etch rate than the etch rate of silicon germanium to form a silicon fin extending across the device region and contacting the shallow trench isolation;

etching the silicon germanium epitaxial layer in an etchant that etches silicon germanium at a substantially higher etch rate than the etch rate of silicon to form a void underlying the silicon fin;

depositing a dielectric overlying the silicon fin and filling the void;

depositing a planarizing layer overlying the dielectric;

etching the planarizing layer and the dielectric to remove the dielectric overlying the silicon fin; and forming a gate structure overlying the silicon fin.

9. The method of claim 8 wherein growing a silicon germanium epitaxial layer comprises growing a layer having a thickness of about 10-30 nm and wherein growing a silicon epitaxial layer comprises growing a silicon layer having a thickness of between 25 and 125 nm.

10. The method of claim 9 wherein the step of forming a shallow trench isolation comprises forming a shallow trench isolation having a height above the silicon substrate substantially equal to the combined thickness of the silicon germanium epitaxial layer and the silicon epitaxial layer.

11. The method of claim 8 wherein depositing a dielectric layer comprises depositing a layer of dielectric selected from the group consisting of silicon oxide, silicon nitride, and mixtures thereof by a process of atomic layer deposition.

12. The method of claim 8 wherein etching the planarizing layer and the dielectric comprises anisotropically etching in an etchant that etches the planarizing layer and the dielectric at substantially the same rate and at a rate substantially greater than the etch rate of the silicon fin.

13. The method of claim 8 wherein the shallow trench isolation comprises a trench filled with a silicon oxide and wherein etching the silicon germanium epitaxial layer comprises etching the silicon germanium epitaxial layer with an etchant that etches silicon germanium at an etch rate substantially greater than the etch rate of silicon and the etch rate of silicon oxide.

14. The method of claim 8 further comprising impurity doping the silicon fin using the gate structure as a dopant mask to form source and drain regions self aligned to the gate structure.

* * * * *